US012614704B2

(12) United States Patent　　(10) Patent No.:　US 12,614,704 B2
Shirouzu　　　　　　　　　　　　(45) Date of Patent:　Apr. 28, 2026

(54) PLASMA POTENTIAL MEASURING DEVICE AND MEASURING METHOD

(71) Applicant: Panasonic Intellectual Property Management Co., Ltd., Osaka (JP)

(72) Inventor: Hiroshi Shirouzu, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 567 days.

(21) Appl. No.: 18/176,516

(22) Filed: Mar. 1, 2023

(65) Prior Publication Data

US 2023/0282463 A1　　Sep. 7, 2023

(30) Foreign Application Priority Data

Mar. 4, 2022　(JP) ................................ 2022-033663
Mar. 4, 2022　(JP) ................................ 2022-033664

(51) Int. Cl.
*H01J 37/32*　　　　(2006.01)
(52) U.S. Cl.
CPC .. *H01J 37/32935* (2013.01); *H01J 37/32174* (2013.01); *H01J 37/32532* (2013.01)
(58) Field of Classification Search
CPC ........... H01J 37/32935; H01J 37/32174; H01J 37/32532
See application file for complete search history.

(56) References Cited

U.S. PATENT DOCUMENTS

| | | | | |
|---|---|---|---|---|
| 8,329,054 | B2 * | 12/2012 | Ichino | ................... H01J 37/321 |
| | | | | 438/689 |
| 8,496,781 | B2 * | 7/2013 | Yokogawa | ........ H01J 37/32174 |
| | | | | 156/345.46 |
| 2002/0167303 | A1 | 11/2002 | Nakano | |
| 2005/0083065 | A1 * | 4/2005 | Zhang | .................... G01N 27/62 |
| | | | | 324/464 |
| 2005/0194094 | A1 | 9/2005 | Yasaka | |
| 2010/0176085 | A1 | 7/2010 | Mizukami et al. | |
| 2013/0287963 | A1 * | 10/2013 | Radovanov | ....... H01J 37/32357 |
| | | | | 427/523 |
| 2021/0236186 | A1 * | 8/2021 | Zenker | .................... A61N 1/44 |

FOREIGN PATENT DOCUMENTS

| | | | |
|---|---|---|---|
| JP | 2002-365315 | A | 12/2002 |
| JP | 3773189 | B2 | 5/2006 |
| JP | 2009-048882 | A | 3/2009 |
| JP | 2019-052863 | A | 4/2019 |
| JP | 2019-174129 | A | 10/2019 |

OTHER PUBLICATIONS

Japanese Office Action issued in Japanese Patent Application No. 2022-033663 dated Dec. 9, 2025.

* cited by examiner

*Primary Examiner* — Lee E Rodak
*Assistant Examiner* — Zannatul Ferdous
(74) *Attorney, Agent, or Firm* — McDonald Hopkins LLC

(57)　　　　　　ABSTRACT
A plasma potential measuring device, including: a detection electrode 162b which is disposed so as to face a plasma P generated in a chamber and at which an electric charge corresponding to an electric potential of the plasma is induced; a potential changing circuit 203 for changing a reference potential of the detection electrode 162b; and a detection circuit 202 for detecting an amount of electric charge or potential induced at the detection electrode 162b.

5 Claims, 7 Drawing Sheets

PLASMA POTENTIAL MEASURING DEVICE AND MEASURING METHOD

CROSS REFERENCE TO RELATED APPLICATION

The present application is based on and claims priority under 35 U.S.C. § 119 with respect to the Japanese Patent Application Nos. 2022-033664 and 2022-033663 both filed on Mar. 4, 2022, of which entire content is incorporated herein by reference into the present application.

TECHNICAL FIELD

The present invention relates to a plasma potential measuring device and measuring method.

BACKGROUND OF THE INVENTION

In various processes for manufacturing an electronic component or a circuit board, a plasma processing apparatus is used, in which a plasma is generated in a processing chamber, and the surface of an object to be processed is etched with the plasma. In order to determine whether a plasma discharge is occurring normally or not in the processing chamber, there is a configuration in which a probe electrode for plasma potential measurement is provided at the sidewall of the processing chamber. The probe electrode detects an electric charge or potential induced in response to changes in the plasma discharge.

For example, Patent Literature 1 (JP3773189B2) disclosed a window-type probe including an electrically conductive support member provided with an opening on at least part of the side facing plasma, and a dielectric member disposed at the opening of the electrically conductive support member, in which a probe electrode is placed on the surface of one side of the dielectric member.

The electric charge or potential at the probe electrode is usually converted into a digital value by an analog-digital converter (ADC), and then, time-series data of the digital values are mathematically processed, from which whether an abnormal discharge has occurred or not is determined.

In Patent Literature 1, the back surface side (the side not facing plasma) of the probe electrode is covered with an electrically insulating film, and an ITO shield electrode for electromagnetically shielding the probe electrode is disposed so as to cover the insulating film. In this case, a back-side capacitance can be formed between the probe electrode and the ITO shield electrode. The back-side capacitance causes the electric potential at the probe electrode to fluctuate, and as a result, the detection sensitivity of the electric potential by plasma is reduced in some cases.

In addition, usually, the detection sensitivity of the electric charge or potential induced in response to changes in plasma discharge is determined by the configuration of the plasma processing apparatus and the position of the probe electrode, and therefore is fixed. When the detection sensitivity is too high or too low, it has been necessary to change the circuit (e.g., amplifier circuit) connected to the probe electrode.

SUMMARY OF THE INVENTION

One aspect of the present disclosure relates to a plasma potential measuring device, including: a detection electrode which is disposed so as to face a plasma generated in a chamber and at which an electric charge corresponding to an electric potential of the plasma is induced; a potential changing circuit for changing a reference potential of the detection electrode; and a detection circuit for detecting an amount of electric charge or potential induced at the detection electrode.

Another aspect of the present disclosure relates to a plasma potential measuring method, in a plasma potential measuring device including a detection electrode which is disposed so as to face a plasma generated in a chamber and at which an electric charge corresponding to an electric potential of the plasma is induced, the method including steps of: detecting an amount of electric charge or potential induced at the detection electrode; and changing a reference potential of the detection electrode, depending on the detected amount of electric charge or potential.

Still another aspect of the present disclosure relates to a plasma potential measuring device, including:
a detection electrode which is disposed so as to face a plasma generated in a chamber and at which an electric charge corresponding to an electric potential of the plasma is induced; a first electrode facing the detection electrode on an opposite side to the plasma; and a first insulating member interposed between the detection electrode and the first electrode, wherein the first electrode is virtually short-circuited with the detection electrode.

Yet another aspect of the present disclosure relates to a plasma potential measuring method, in a plasma potential measuring device including a detection electrode which is disposed so as to face a plasma generated in a chamber and at which an electric charge corresponding to an electric potential of the plasma is induced, a first electrode facing the detection electrode on an opposite side to the plasma, and a first insulating member interposed between the detection electrode and the first electrode, the method including: measuring an electric charge or potential induced at the detection electrode by the plasma, while the first electrode is virtually short-circuited with the detection electrode.

According to the present disclosure, the state of the plasma generated in the chamber can be detected accurately.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
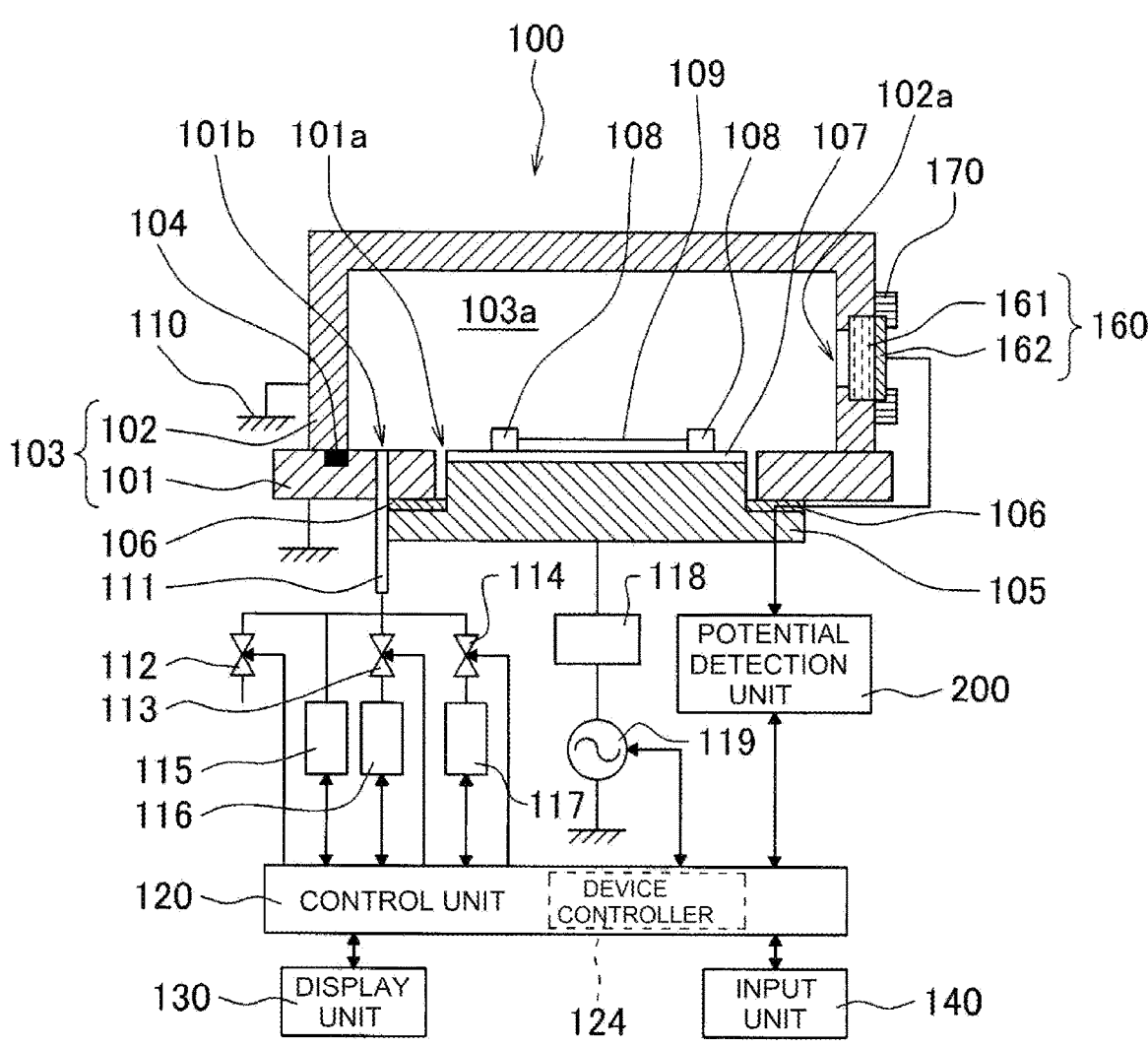
FIG. 1 is a cross-sectional conceptual diagram showing a schematic structure of an example of a plasma processing apparatus for use in conjunction with a plasma potential measuring device and measuring method according to an embodiment of the present disclosure.

Embodiments of the present disclosure will be described below by way of examples, but the present disclosure is not limited to the examples described below. In the following description, specific numerical values and materials are exemplified in some cases, but other numerical values and other materials may be applied as long as the effects of the present disclosure can be obtained. In the present specification, the phrase "a numerical value A to a numerical value B" means to include the numerical value A and the numerical value B, and can be rephrased as "a numerical value A or more and a numerical value B or less." In the following description, when the lower and upper limits of numerical values related to specific physical properties, conditions, etc. are mentioned as examples, any one of the mentioned lower limits and any one of the mentioned upper limits can be combined in any combination as long as the lower limit does not exceed the upper limit. When a plurality of materials are mentioned as examples, one kind of them may be selected and used singly, or two or more kinds of them may be used in combination.

The present disclosure encompasses a combination of matters recited in any two or more claims selected from plural claims in the appended claims. In other words, as long as no technical contradiction arises, matters recited in any two or more claims selected from plural claims in the appended claims can be combined.

A plasma potential measuring device according to one embodiment of the present disclosure (hereinafter sometimes referred to as a "plasma potential measuring device according to the first embodiment") includes: a detection electrode which is disposed so as to face a plasma generated in a chamber and at which an electric charge corresponding to an electric potential of the plasma is induced; a potential changing circuit for changing a reference potential of the detection electrode; and a detection circuit for detecting an amount of electric charge or potential induced at the detection electrode.

The detection electrode is capacitively coupled with the plasma, and at the detection electrode, an electric charge corresponding to the state of the plasma is induced. Therefore, by measuring the amount of electric charge induced at the detection electrode, the state of the plasma can be detected. Alternatively, by measuring an electric potential at the detection electrode caused by the induced electric charge (e.g., a change of electric potential from the reference potential), the amount of electric charge induced at the detection electrode can be detected, and the state of the plasma can be detected.

As will be described later, the capacitive coupling between the detection electrode and plasma varies depending on the reference potential of the detection electrode. Therefore, by providing a potential changing circuit for changing the reference potential of the detection electrode, it is possible to manipulate the capacitive coupling value between the detection electrode and the plasma, and thus can adjust the detection sensitivity of the plasma potential in a simple and convenient manner.

The potential changing circuit is preferably virtually short-circuited with the detection electrode. This can avoid the electric charge induced at the detection electrode from flowing into the potential changing circuit, or the electric charge from being supplied from the potential changing circuit to the detection electrode. Thus, the amount of electric charge induced at the detection electrode can be detected accurately.

Here, the potential changing circuit and the detection electrode are virtually short-circuited means that the electric potential of the detection electrode is controlled to be the same potential as the output voltage of the potential changing circuit. However, unlike in the case of a normal short circuit, the current will not necessarily flow from the detection electrode toward the potential changing circuit or from the potential changing circuit to the detection electrode, and the current flowing to the detection electrode can be controlled independently of the current supplied from the potential changing circuit.

As a method of causing a virtual short circuit, any circuit configuration can be adopted as long as the reference potential of the detection electrode is controlled as described above, depending on the output voltage of the potential changing circuit. A virtual short circuit can be realized by, for example, interposing an operational amplifier circuit between the detection electrode and the potential changing circuit. For example, a common operational amplifier circuit includes a current mirror circuit configured by combining a plurality of transistors. An IC chip commercially available as a common operational amplifier circuit may be used.

Preferably, the detection circuit includes an operational amplifier. One of the input terminals (one of the non-inverting and inverting input terminals) of the operational amplifier is connected to the detection electrode, to amplify, within the range of the operating voltage of the operational amplifier, the amount of electric charge induced at the detection electrode or the electric potential change at the detection electrode caused by the induced electric charge, and to output a voltage corresponding to the amount of induced electric charge, to the output terminal. One of the input terminals of the operational amplifier is virtually short-circuited with the other one of the input terminals (the other one of the non-inverting and inverting input terminals) of the operational amplifier, and this allows the detection electrode connected to one of the input terminals of the operational amplifier, too, to be virtually short-circuited with the other one of the input terminals of the operational amplifier. Therefore, by changing the voltage inputted to the other one of the input terminals of the operational amplifier, the reference potential of the detection electrode can be changed.

By changing the reference potential of the detection electrode, the voltage inputted to one of the input terminals of the operational amplifier can be adjusted such that the voltage outputted to the output terminal of the operational amplifier shows, for example, a linear change against the predicted changes in the plasma potential, and the detection sensitivity can be improved.

For example, with a constant voltage corresponding to the reference potential applied to the other one of the input terminals of the operational amplifier, by configuring the potential changing circuit so as to be able to change the constant voltage, the reference potential of the detection electrode can be changed, the capacitive coupling value between the detection electrode and the plasma can be easily manipulated, and the detection sensitivity of the plasma potential can be adjusted in a simple and convenient manner. At this time, the electric charge induced at the detection electrode will not flow into the potential changing circuit connected to the other one of the input terminals of the operational amplifier, and the amount of electric charge induced at the detection electrode can be detected accurately.

The potential changing circuit is able to generate at least two different reference potentials, and is able to switch, as needed, the reference potential to be outputted. The potential changing circuit may be able to continuously change the reference potential to be outputted, within a predetermined voltage range. An example of the potential changing circuit is a switching power supply circuit. The switching power supply circuit is able to change the reference potential to be outputted to any electric potential, by changing the on-off ratio (duty ratio) in a switching control of the input voltage. The switching system is not limited to a particular one. The switching power supply circuit may be an AC/DC converter using an AC power source as an input voltage, or may be a DC/DC converter using a DC power source as an input voltage.

A plasma potential detection method according to an embodiment of the present disclosure includes, in a plasma potential measuring device including a detection electrode which is disposed so as to face a plasma generated in a chamber and at which an electric charge corresponding to an electric potential of the plasma is induced, a step (i) of detecting an amount of electric charge or potential induced at the detection electrode, and a step (ii) of changing a reference potential of the detection electrode, depending on the detected amount of electric charge or potential.

The detection electrode may be connected to one of the input terminals of the operational amplifier. One of the input terminals of the operational amplifier is virtually short-circuited with the other one of the input terminals of the operational amplifier. In this case, for example, in step (ii), the reference potential can be changed by changing the voltage applied to the other one of the input terminals of the operational amplifier.

A plasma potential measuring device according to another embodiment of the present disclosure (hereinafter sometimes referred to as a "plasma potential measuring device according to the second embodiment") includes: a detection electrode (hereinafter sometimes referred to as a "probe electrode") which is disposed so as to face a plasma generated in a chamber and at which an electric charge corresponding to an electric potential of the plasma is induced; a first electrode facing the detection electrode on the opposite side to the plasma; and a first insulating member interposed between the detection electrode and the first electrode.

The detection electrode is capacitively coupled with the plasma, and at the detection electrode, an electric charge corresponding to the state of the plasma is induced. Therefore, by measuring the electric potential or charge at the detection electrode, the state of the plasma can be detected.

The first electrode can have a function of shielding the detection electrode from electromagnetic waves coming from outside the chamber, and shielding the electromagnetic waves within the chamber from leaking outside. However, since the first electrode faces the detection electrode via the first insulating member, a back-side capacitance is formed between the first electrode and the detection electrode. When the back-side capacitance is present, as the state of the plasma changes, it may occur that the electric charge accumulated in the detection electrode moves to the back-side capacitance, or, the electric charge accumulated in the back-side capacitance moves to the detection electrode, which may cause a redistribution of electric charge between the detection electrode and the back-side capacitance. As a result, the detection accuracy of the state of the plasma is lowered in some cases, by the amount of the electric charge having moved to the back-side capacitance or the detection electrode.

The first electrode is virtually short-circuited with the detection electrode. This allows the electric current flowing in the detection electrode and the electric potential thereof to be measured without the influence of the back-side capacitance, which can improve the accuracy of the measurement of the state of the plasma. Here, the first electrode being virtually short-circuited with the detection electrode means that the electric potential at the first electrode is controlled to be the same as the electric potential at the detection electrode, in response to changes in electric potential at the detection electrode, as described above. The method of causing a virtual short circuit is not limited to a particular one, and any circuit configuration can be adopted. A virtual short circuit is realized by, for example, interposing an operational amplifier circuit between the detection electrode and the first electrode.

The plasma potential measuring device may further include a second electrode facing the first electrode on the opposite side to the detection electrode. A second insulating member is interposed between the first electrode and the second electrode. The second insulating member may be of the same material as that of the first dielectric member. The second electrode has a function of shielding the detection electrode and the first electrode from electromagnetic waves coming from outside of the chamber, and shielding the electromagnetic waves within the chamber from leaking outside. To the second electrode, a constant voltage may be applied. For example, the voltage applied to the second electrode may be the same as the voltage applied to the sidewall of the chamber, or may be the ground voltage.

A plasma potential detection method according to another embodiment of the present disclosure includes, in a plasma potential measuring device including a detection electrode which is disposed so as to face a plasma generated in a chamber and at which an electric charge corresponding to an electric potential of the plasma is induced, a first electrode facing the detection electrode on the opposite side to the plasma, and a first insulating member interposed between the detection electrode and the first electrode, measuring an electric charge or potential induced at the detection electrode by the plasma, while the first electrode is virtually short-circuited with the detection electrode. This allows the electric current flowing in the detection electrode and the electric potential thereof to be measured without the influence of the back-side capacitance. In the above plasma potential detection method, the plasma potential measuring device may further include a second electrode facing the first electrode on the opposite side to the detection electrode, and a second dielectric member interposed between the first electrode and the second electrode.

In the following, the plasma potential detection device and the plasma potential detection method of the present embodiment will be specifically described with reference to the drawings, together with a specific example of a plasma processing apparatus in which a plasma, being subjected to the detection, is generated.

(Plasma Processing Apparatus)

A plasma processing apparatus includes a processing chamber, an electrode section which is provided in the processing chamber and on which an object to be processed is placed, and a high-frequency power supply section for applying a high-frequency power to the electrode section. When a gas for plasma generation is supplied into the processing chamber, and a high-frequency power is applied to the electrode section, a plasma is generated in the processing chamber. The generated plasma can be used, for example, to etch the surface of the object to be processed placed on the electrode section. A detection circuit for detecting a plasma potential is connected to the plasma processing apparatus. The output of the detection circuit is connected to a signal analyzer. The signal analyzer detects the plasma potential based on the output of the detection circuit, and determines whether the generated plasma is normal or not, based on the detected plasma potential.

FIG. 1 is a cross-sectional conceptual diagram showing a schematic structure of a plasma processing apparatus 100 in which a plasma subjected to be detected for plasma potential, is to be generated. A processing chamber 103a is formed by bringing a vacuum chamber 103 constituted of a horizontal base section 101 and a lid section 102 into a sealed state. The lid section 102 is disposed so as to be vertically movable by means of a lifting means (not shown). When the lid section 102 descends and comes in contact with the upper surface of the base section 101, the vacuum chamber 103 is brought into a sealed state. At this time, a sealing member 104 is placed between the lid section 102 and the base section 101, by which the hermetically sealed state of the processing chamber 103a is secured. In the processing chamber 103a, an object to be processed 109 is processed with plasma. The base section 101 is provided with an opening 101a, into which an electrode section 105 is fitted with an insulating member 106 therebetween, so as to close the opening 101a. An upper surface of the electrode section 105 is covered with an insulating layer 107. A guide member 108 for positioning the object to be processed 109 is disposed on the upper surface of the insulating layer 107.

A through-hole 101b is formed at the periphery of the opening 101a of the base section 101. A pipe line 111 is inserted into the through hole 101b, and to the pipe line 111, a vent valve 112, a gas supply valve 113, a vacuum valve 114, and a vacuum gauge 115, are connected. To the gas supply valve 113 and the vacuum valve 114, a gas supply unit 116 and a vacuum pump 117 are further connected, respectively. By turning the vacuum valve 114 to open and operating the vacuum pump 117, the gas in the processing chamber 103a is discharged, bringing the chamber into a reduced pressure state. The degree of vacuum in the processing chamber 103a is measured by the vacuum gauge 115. On the other hand, when the gas supply valve 113 is turned to open, a gas for plasma generation is supplied from the gas supply unit 116 into the processing chamber 103a. The gas supply unit 116 has a flow rate adjustment function incorporated therein, by which the flow rate of the gas for plasma generation supplied into the processing chamber 103a is adjusted. When the vent valve 112 is turned to open, air is supplied into the processing chamber 103a.

To the electrode section 105, a high-frequency power supply unit 119 is electrically connected via a matching device 118. On the other hand, the lid section 102 is grounded to a grounded part 110. When a gas for plasma generation is supplied into the processing chamber 103a, and the high-frequency power supply unit 119 is operated, a high-frequency voltage is applied between the electrode section 105 and the lid section 102. This causes a plasma to be generated in the processing chamber 103a. The matching device 118 matches the impedance of a plasma discharge circuit (not shown) for generating a plasma with that of the high-frequency power supply unit 119. The vent valve 112, the gas supply valve 113, the vacuum valve 114, the vacuum gauge 115, the gas supply unit 116, the vacuum pump 117, and the high-frequency power supply unit 119 are controlled by a device controller 124 in a control unit 120. That is, the device controller 124 has a normal operation control function for executing a plasma processing operation. To the control unit 120, a display unit 130, an input unit 140, and a potential detection unit 200 are connected. The display unit 130 displays the result of abnormality determination made by the later-described signal analyzer, and the like. To the input unit 140, a process recipe and the like are inputted.

A plasma potential detection sensor 160 is disposed so as to cover an opening 102a provided in the lid section 102. The plasma potential detection sensor 160 includes a dielectric member 161 and an electrode unit 162. The plasma potential detection sensor 160 and the potential detection unit 200 constitute a plasma potential measuring device.

(Plasma Potential Measuring Device and Measuring Method)

Figure 2:
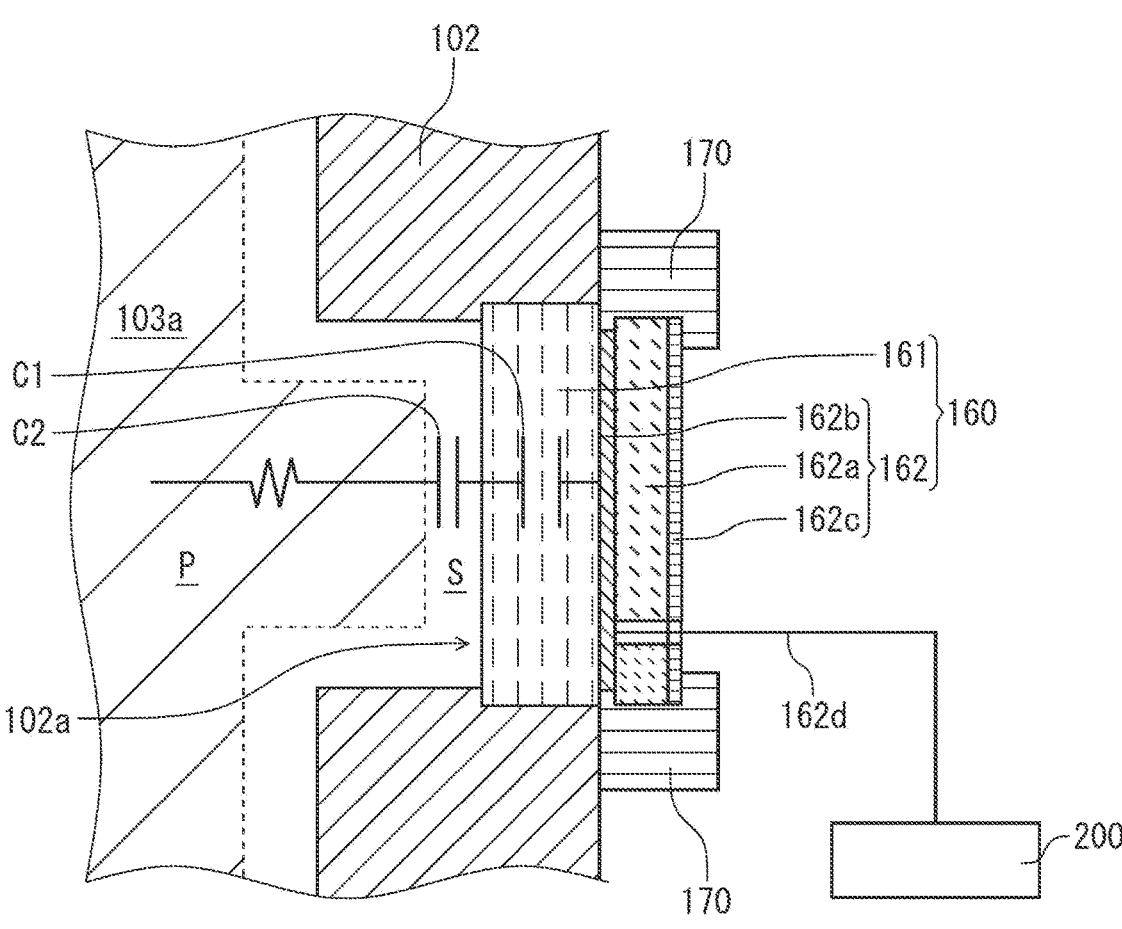
FIG. 2 is a cross-sectional conceptual diagram showing an example of an essential part of a plasma potential measuring device according to a first embodiment.

FIG. 2 is a cross-sectional conceptual diagram showing an example of an essential part of a plasma potential measuring device according to the first embodiment. The plasma potential measuring device includes a plasma potential detection sensor 160, and a potential detection unit 200. The plasma potential detection sensor 160 is fixed by support members 170 to the sidewall of the chamber of the plasma processing apparatus, on the outside of the lid section 102 (on the opposite side to the processing chamber 103a). The plasma potential detection sensor 160 includes a dielectric member 161 and an electrode unit 162. The dielectric member 161 has a flat plate shape, with one of its surfaces facing the processing chamber 103a in which a plasma is to be generated, and the other surface facing a probe electrode 162b that constitutes the electrode unit 162. The material of the dielectric member 161 is, for example, an optically transparent glass. The material of the support members 170 may be any material that is electrically conductive, and is, for example, a metal.

The electrode unit 162 is constituted of the probe electrode (detection electrode) 162b which is disposed on the dielectric member 161 side, a shield electrode 162c disposed so as to face the probe electrode 162b, and a glass plate 162a interposed therebetween. The probe electrode 162b and the dielectric member 161 are fixed by the support members 170 so as to be in close contact with each other. The probe electrode 162b is connected to the potential detection unit 200 via a detection lead wire 162d. The shield electrode 162c electrically shields the electrode unit 162 from outside. The probe electrode 162b and the shield electrode 162c are formed by, for example, coating the surface of the glass plate 162a with a transparent electrically conductive material of ITO (indium tin oxide). Therefore, through the plasma potential detection sensor 160, the inside of the processing chamber 103a can be visually recognized from outside.

The probe electrode 162b and the shield electrode 162c are applied with a predetermined reference potential. The reference potential is, usually, a ground potential. In the present embodiment, however, it is configured such that the reference potential applied to the probe electrode 162b is changeable from the ground potential.

When a plasma discharge occurs inside the processing chamber 103a, the probe electrode 162b is electrically connected to the plasma P, through the dielectric member 161 and a sheath (space-charge layer) S formed at the interface between a generated plasma P and the dielectric member 161. That is, an electric circuit in which a capacitor C1 formed by the dielectric member 161, a capacitor C2 having a capacitance corresponding to that of the sheath S, and a resistance by the plasma P are connected in series, is formed, and at the probe electrode 162b, an electric potential and an electric charge are induced according to the state of the plasma P. To be specific, the amount of electric charge injected into the probe electrode 162b represents the changes in plasma potential that reflect the state of the plasma P. On the other hand, the electric charge generated in the shield electrode 162c are released to the grounded lid section 102 via the support members 170, and the noise is reduced.

Therefore, the sensitivity of the plasma potential detection sensor 160 is dependent on the capacitances of the capacitors C1 and C2. Of these capacitances, the capacitance of the capacitor C1 is determined by the configuration of the plasma processing apparatus, and is difficult to change. However, the capacitance of the capacitor C2 is approximately inversely proportional to the thickness of the sheath S, and can be adjusted by changing the reference voltage applied to the probe electrode 162b, from the ground voltage.

Usually, the plasma potential is positive with respect to the ground potential, and is higher than the potential at the probe electrode 162b. In this case, when the reference potential of the probe electrode 162b is raised from the ground potential, the voltage applied to the sheath S (i.e., the potential difference across the capacitor C2) decreases. Along with this, the thickness of the sheath S is reduced, and the capacitance of the capacitor C2 increases. On the other hand, when the potential of the probe electrode 162b is lowered below the ground potential, the voltage applied to the sheath S (i.e., the potential difference across the capacitor C2) increases. Along with this, the thickness of the sheath S is increased, and the capacitance of the capacitor C2 decreases.

The amount of electric charge injected into the probe electrode 162b is roughly proportional to a product obtained by multiplying the combined capacitance of the capacitors C1 and C2 by the plasma potential, and without considering the influence from the capacitor C1, is roughly proportional to a product obtained by multiplying the capacitance of the capacitor C2 by the plasma potential. Therefore, with increasing the capacitance of the capacitor C2, the detection sensitivity is increased, and with decreasing the capacitance of the capacitor C2, the detection sensitivity is reduced. Therefore, by changing the reference potential applied to the probe electrode 162b, the capacitance of the capacitor C2 is changed, and in this way, the detection sensitivity can be adjusted.

From another perspective, by changing the reference potential applied to the probe electrode 162b, the thickness of the sheath S can be changed. With reducing the thickness of the sheath S, the probe electrode 162b and the plasma are brought closer to each other, and thus, the detection sensitivity can be increased. On the other hand, with increasing the thickness of the sheath S, the probe electrode 162b and the plasma are spaced further away from each other. It can be said therefore that the detection sensitivity is reduced.

(Potential Detection Unit)

Figure 3:
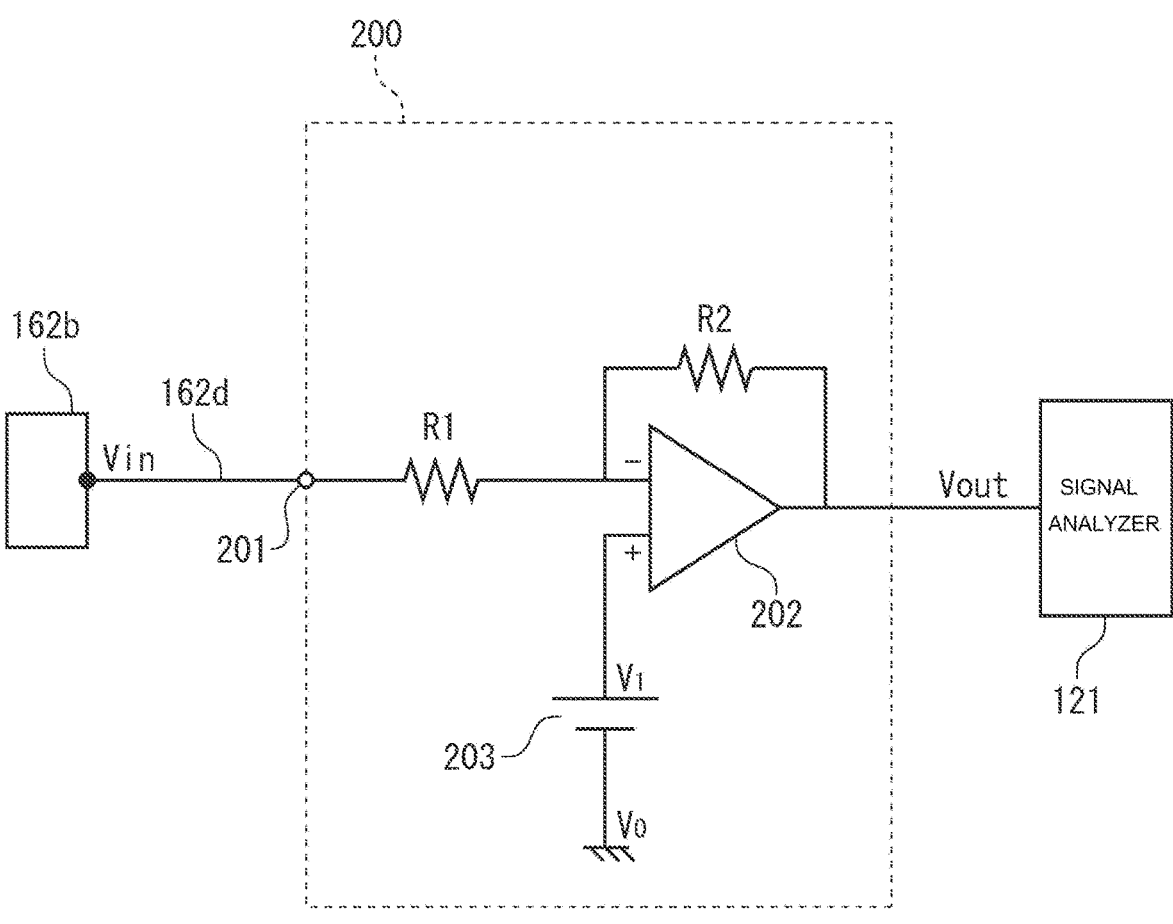
FIG. 3 is a circuit diagram showing an example of the configuration of a potential detecting section included in the plasma potential measuring device.

FIG. 3 is a circuit diagram showing an example of the configuration of a potential detecting section 200. The potential detecting section 200 includes an input terminal 201 connected to the probe electrode 162b via the detection lead wire 162d, an operational amplifier 202, and a reference power source 203 which is a potential changing circuit.

One of the input terminals (the inverted input terminal in FIG. 3) of the operational amplifier 202 is connected to the input terminal 201 via a resistor R1. The other one of the input terminals (the non-inverting input terminal in FIG. 3) of the operational amplifier 202 is connected to the reference power source 203. Through the reference power source 203, a reference potential $V_1$ is applied to the other one of the input terminals of the operational amplifier 202. To one end of the reference power source 203, a constant voltage (e.g., ground potential) $V_0$ is applied. The reference power source 203 creates a voltage difference of $V_1-V_0$, and supplies a potential which is higher by $V_1-V_0$ than $V_0$ (i.e., the reference potential $V_1$), to the other one of the input terminals of the operational amplifier 202. The voltage generated by the reference power source 203 is changeable by the control unit of the plasma processing apparatus. That is, the reference potential $V_1$ supplied to the other one of the input terminals of the operational amplifier 202 is changed through the control of the reference power source 203.

The output terminal of the operational amplifier 202 is connected to the one of the input terminals of the operational amplifier 202 via a feedback resistor R2. In this way, the operational amplifier 202, together with the resistors R1 and R2, forms an inverting amplifier circuit (detection circuit). The operational amplifier 202 amplifies a potential Vin of the probe electrode 162b within the operating voltage range of the operational amplifier 202, and outputs an amplified voltage Vout to the output terminal. The voltage Vout is inputted to a signal analyzer 121. Although not shown in FIG. 1, the signal analyzer 121 is provided, for example, within the control unit of the plasma processing apparatus.

One of the input terminals of the operational amplifier 202 is virtually short-circuited with the other one of the input terminals. As a result, due to the effect of the virtual short circuit, the potential at the probe electrode 162b is controlled to the reference potential $V_1$ which is an electric potential at the other one of the input terminals of the operational amplifier 202.

According to the potential detection unit 200 of the present embodiment, the reference potential $V_1$ applied to the probe electrode 162b is changeable by the reference power source 203. Therefore, the thickness of the sheath S can be changed according to the reference potential $V_1$, and the detection sensitivity of the potential detection sensor 160 can be adjusted. For example, when the potential Vin at the probe electrode 162b during normal plasma discharge is low and the voltage Vout of the output terminal is predicted to fall, even during an assumed abnormal discharge, within a narrower voltage range than the operating voltage range of the operational amplifier 202, the reference potential $V_1$ is raised by means of the reference power source 203, to increase the detection sensitivity. On the other hand, when the potential Vin of the probe electrode 162b during normal discharge is sufficiently high, and the voltage Vout of the output terminal is near the upper or lower limit of the operating voltage range of the operational amplifier 202 during normal plasma discharge, the voltage $V_1$ of the reference power source 203 is lowered, to decrease the detection sensitivity.

When the reference potential $V_1$ is raised in order to increase the detection sensitivity, the potential Vin of the probe electrode 162b increases. When the reference potential $V_1$ is lowered in order to decrease the detection sensitivity, the potential Vin of the probe electrode 162b decreases. A control by which the reference potential $V_1$ is changed by means of the reference power source 203 such that that the potential Vin of the probe electrode 162b falls within a predetermined voltage range may be performed.

Figure 4:
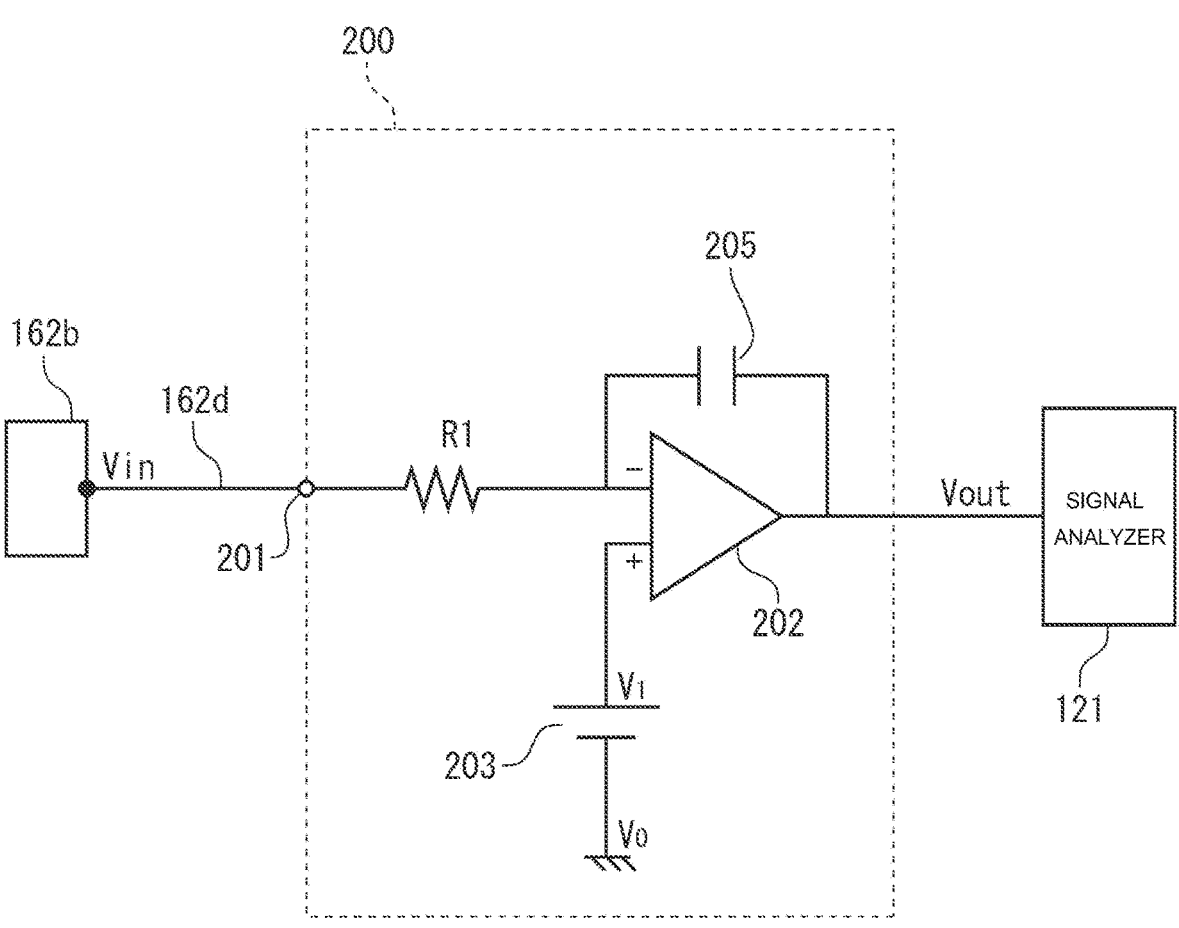
FIG. 4 is a circuit diagram showing another example of the configuration of the potential detecting section included in the plasma potential measuring device.

FIG. 4 shows another example of the configuration of the potential detecting section 200. As shown in FIG. 4, in the operational amplifier 202, the feedback resistor R2 may be replaced with a capacitor 205 which is connected between the output terminal and the inverting input terminal. In this case, the operational amplifier 202 constitutes an integration circuit, and amplifies the amount of electric charge induced at the probe electrode 162*b*. Then, a voltage corresponding to the amplified amount of electric charge is outputted to the output terminal.

Figure 5:
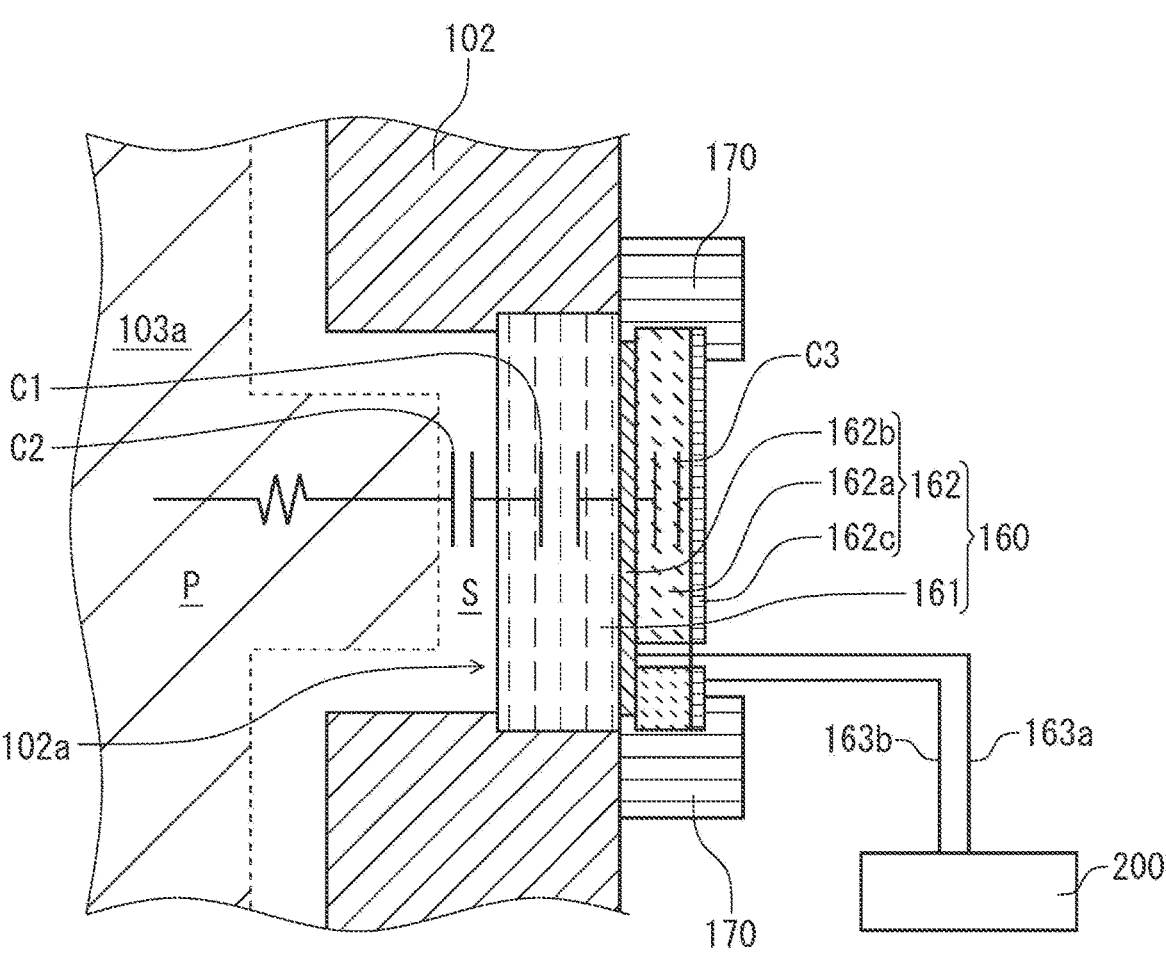
FIG. 5 is a cross-sectional conceptual diagram showing an example of an essential part of a plasma potential measuring device according to a second embodiment.

FIG. 5 is a cross-sectional conceptual diagram showing an example of an essential part of a plasma potential measuring device according to the second embodiment. The plasma potential measuring device includes a plasma potential detection sensor 160, and a potential detection unit 200. The plasma potential detection sensor 160 is fixed to the sidewall of the chamber of the plasma processing apparatus by the support members 170. The plasma potential detection sensor 160 includes a dielectric member 161 and an electrode unit 162. The dielectric member 161 has a flat plate shape, with one of its surfaces facing the processing chamber 103*a* in which a plasma is to be generated, and the other surface facing the probe electrode 162*b* that constitutes the electrode unit 162. The material of the dielectric member 161 is, for example, an optically transparent glass.

The electrode unit 162, likewise of the first embodiment, includes the probe electrode 162*b* (detection electrode) disposed on the dielectric member 161 side, the first electrode 162*c* disposed to face the probe electrode 162*b*, and the glass plate 162*a* (first insulating member) interposed therebetween. The probe electrode 162*b* is connected to the potential detection unit 200 via a wiring 163*a*.

The material of the support members 170 may be any material that is electrically conductive, and is, for example, a metal. However, when the support members 170 is made of an electrically conductive material, it is insulated from the first electrode 162*c*, and electrically separated therefrom.

In the example of FIG. 5, a back-side capacitance C3 is formed, by way of the glass plate 162*a* interposed between the probe electrode 162*b* and the first electrode 162*c*. The back-side capacitance C3 is connected in series with a capacitor C1 formed of the dielectric member 161 and a capacitor C2 having a capacitance corresponding to the sheath S. In this case, the electric charge corresponding to the state of the plasma P accumulated in the probe electrode 162*b* via the capacitors C1 and C2 is redistributed with the back capacitance C3. This may result in failure of detecting the state of the plasma accurately based on the amount of electric potential or charge induced at the probe electrode 162*b*.

However, by virtually short-circuited the probe electrode 162*b* and the first electrode 162*c* with each other, the accumulation of the electric charge in the back-side capacitance C3 can be avoided, and the fluctuations of the accumulated electric charge in the probe electrode 162*b* due to the back-side capacitance C3 can be suppressed. Therefore, with the probe electrode 162*b* and the first electrode 162*c* virtually short-circuited with each other, by measuring the electric charge or potential induced at the probe electrode 162*b*, the state of the plasma can be accurately determined based on the measured amount of electric charge or potential.

Figure 6:
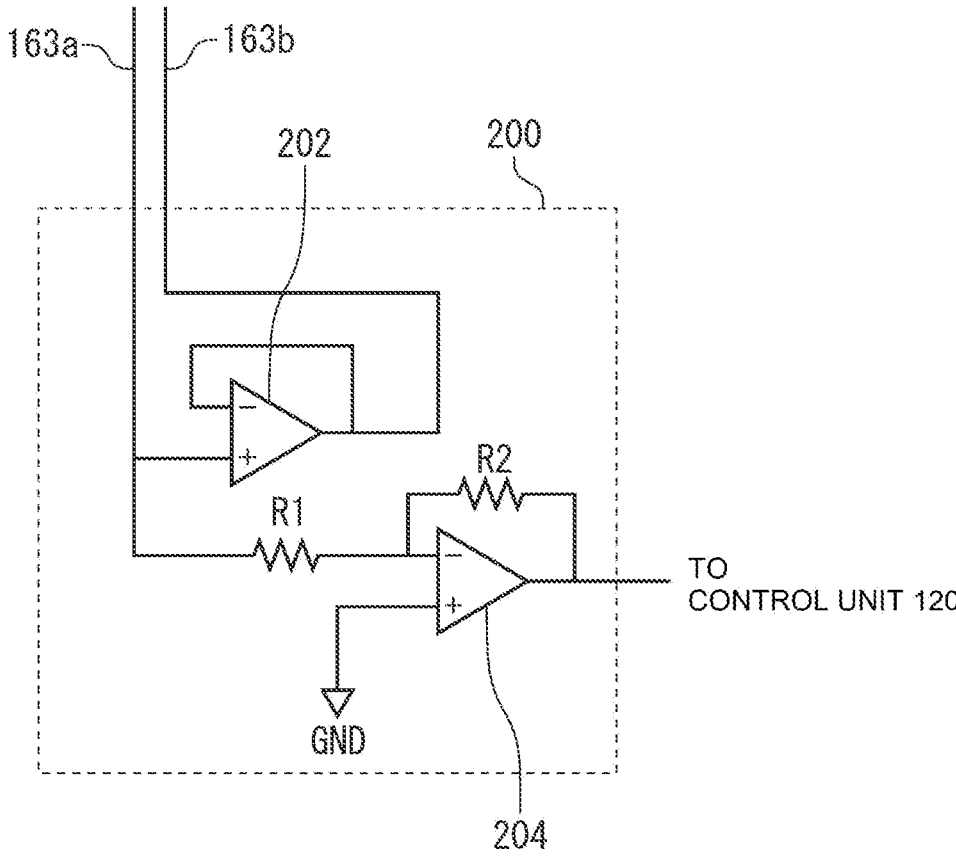
FIG. 6 is a circuit diagram showing an example of the configuration of a potential detecting section included in the plasma potential measuring device according to the second embodiment.

FIG. 6 is a circuit diagram showing an example of the configuration of the potential detecting section 200 in which the probe electrode 162*b* is connected to the first electrode 162*c*, and is an example of a circuit in which the probe electrode 162*b* and the first electrode 162*c* are virtually short-circuited with each other. The potential detection section 200 includes a first operational amplifier 202 and a second operational amplifier 204.

The non-inverting input terminal of the first operational amplifier 202 is connected to the probe electrode 162*b* via the wiring 163*a*. The output terminal of the first operational amplifier 202 is connected to the first electrode 162*c* via a wiring 163*b*. The output terminal of the first operational amplifier 202 is also connected to the inverting input terminal of the first operational amplifier 202, without via a feedback resistor. In this way, the first operational amplifier 202 constitutes a non-inverting amplifier circuit with a gain of 1. The probe electrode 162*b* connected to the non-inverting input terminal of the first operational amplifier 202 and the first electrode 162*c* connected to the inverting input terminal of the first operational amplifier 202 are virtually short-circuited with each other.

Due to the effect of the virtual short circuit of the operational amplifier, the voltage at the inverting input terminal of the first operational amplifier 202 connected to the first electrode 162*c* becomes equal to the voltage at the non-inverting input terminal of the first operational amplifier 202 connected to the probe electrode 162*b*. As a result, it is controlled such that no voltage is applied to the back-side capacitance C3, and the amount of electric potential or charge induced at the probe electrode 162*b* can be detected with less influence from the back-side capacitance C3, and thus, the state of the plasma can be detected with high accuracy.

The inverting input terminal of the second operational amplifier 204 is connected to the probe electrode 162*b* via the resistor R1. The non-inverting input terminal of the second operational amplifier 204 is grounded. The output terminal of the second operational amplifier 204 is connected to the inverting input terminal of the second operational amplifier 204 via the feedback resistor R2. In this way, the second operational amplifier 204 constitutes an inverting amplifier circuit, and a voltage obtained by amplifying the electric potential at the probe electrode 162*b* is outputted to the output terminal of the second operational amplifier 204. The output voltage is sent to the signal analyzer of the control unit 120.

In the second operational amplifier 204, the feedback resistor R2 may be replaced with the capacitor C2 (not shown) which is connected between the output terminal and the inverting input terminal. In this case, the second operational amplifier 204 constitutes an integrating circuit, and amplifies the amount of electric charge induced at the probe electrode 162*b*, so that a voltage corresponding to the amplified amount of electric charge is outputted to the output terminal.

The first electrode 162*c* can also serve to electromagnetically shield the probe electrode 162*b* from outside. It may occur that external noise induces an electric charge at the first electrode 162*c*, and a current flows to the inverting input terminal side of the first operational amplifier 202 via the wiring 163*b*. However, this current is supplied from the power source voltage of the first operational amplifier 202, and will not flow into the non-inverting input terminal side of the first operational amplifier 202 connected to the probe electrode 162*b*. Therefore, the electric charge or potential induced at the probe electrode 162*b* can be detected accurately, with less influence of external noise.

Figure 7:
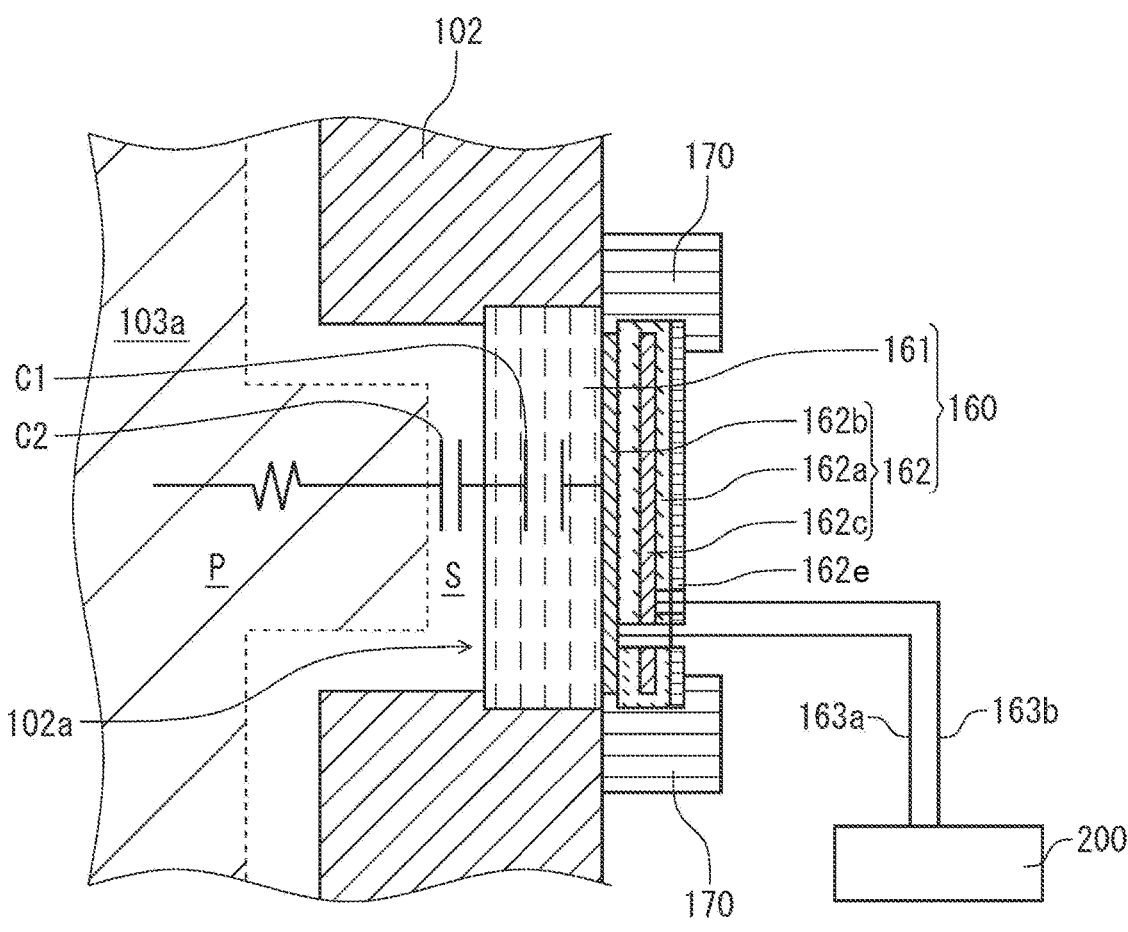
FIG. 7 is a cross-sectional conceptual diagram showing another example of an essential part of the plasma potential measuring device according to the second embodiment.

FIG. 7 is a cross-sectional conceptual diagram showing another example of an essential part of the plasma potential measuring device. In the example of FIG. 7, the electrode unit 162 further includes a second electrode 162*e* facing the first electrode 162c on the opposite side of the probe electrode 162b, via a glass plate 162a (second insulating member). In other words, the first electrode 162c is interposed between the probe electrode 162b and the second electrode 162e, with the glass plate 162a, which is an insulating member, interposed between the probe electrode 162b and the first electrode 162c and between the second electrode 162e and the first electrode 162c. The second electrode 162e is, for example, like the probe electrode 162b and the first electrode 162c, an ITO transparent electrode. In the example of FIG. 7, the first electrode 162c is disposed so as to be embedded in the glass plate 162a, but may be sandwiched between two glass plates (insulating members). In that case, an insulating member (first insulating member) interposed between the probe electrode 162b and the first electrode 162c, and an insulating member (second insulating member) interposed between the second electrode 162e and the first electrode 162c may be made of the same material or may be made of different materials. The insulating member may be made of a low-dielectric-constant material, for reducing the back-side capacitance generated between the electrodes 162b, 162c, and 162e.

The probe electrode 162b and the first electrode 162c are connected to the detection circuit 200 via the wirings 163a and 163b, respectively. As the configuration of the detection circuit, a configuration similar to that of the above-described circuit shown in FIG. 3 can be used.

The second electrode 162e electromagnetically shields the probe electrode 162b and the first electrode 162c from outside. In this example, the material of the support member 170 is a conductive material, such as a metal, and the second electrode 162e and the lid section 102 may be electrically connected to each other. The electric charge generated at the second electrode 162e due to external noise is released to the lid section 102 via the support members 170, and the noise is reduced. A constant voltage may be applied to the second electrode 162e. When a constant voltage is applied to the second electrode 162e, the constant voltage is preferably the same as the voltage applied to the lid section 102. The constant voltage may be a ground voltage.

Since the first electrode 162c and the second electrode 162e are capacitively coupled via an insulating member (the glass plate 162a), it may occur that, along with when the electric charge generated in the second electrode 162e due to external noise is released to the lid section 102, a corresponding current also flows to the inverting input terminal side of the first operational amplifier 202 connected to the first electrode 162c. However, this current is supplied from the power source voltage of the first operational amplifier 202 and will not flow into the non-inverting input terminal side of the first operational amplifier 202 connected to the probe electrode 162b. Therefore, the electric charge or potential induced at the probe electrode 162b can be detected accurately with less influence of external noise.

(Control Unit)

The control unit 120 includes a signal analyzer. The signal analyzer determines whether the state of the plasma is normal or not, based on the voltage outputted from the potential detection unit 200. When it is determined that the state of the plasma is not normal and is in an abnormal discharge state, a retry processing, a cumulative plasma processing, a maintenance determination, and the like can be executed. Here, it is not necessary that the retry processing, the cumulative plasma processing, and the maintenance determination are all to be executed. One or more of these processes are executed.

A method for determining an abnormal discharge state of the plasma includes, but is not limited to: a method in which when the output voltage from the potential detection unit 200 exceeds a predetermined threshold voltage (or becomes less than the threshold voltage), the discharge state of the plasma is determined as abnormal; and a method in which the time average value of the output voltage from the potential detection unit 200 in a predetermined period is calculated based on the time-series data of the output voltage from the potential detection unit 200, and when the time average value exceeds a predetermined value, an abnormal discharge is determined as detected.

(Device Controller)

The device controller 124 may include, although not shown, a processing history storage part, a retry processing part, a cumulative plasma processing part, and a maintenance determination function part. That is, the device controller 124 can, in addition to the normal operation control function as described above, determine the state of plasma discharge in the processing chamber 103a based on the detection result made by the signal analyzer on the abnormal discharge, and perform resetting of the above-described plasma processing. The determination of the state of plasma discharge and the resetting of the plasma processing can be executed by the retry processing part, the cumulative plasma processing part, and the maintenance determination part. The processing history storage part stores the data, such as the changes over time in the output voltage from the potential detection unit 200 which are temporarily recorded in the memory, and the intermediate data required by the signal analyzer for determination of the detection of abnormal discharge, as the processing history data of the plasma processing apparatus 100. In this way, detailed processing history data can be acquired for the object to be processed 109 which have been subjected to processing in the plasma processing apparatus 100, and the traceability for quality control and production control can be ensured.

The plasma potential measuring device and measuring method according to the present invention can be applied to a plasma processing apparatus.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

REFERENCE NUMERALS

100: plasma processing apparatus
  101: base section
    101a: opening
    101b: through-hole
  102: lid section
    102a: opening
  103: vacuum chamber
    103a: processing chamber
  104: sealing member
  105: electrode section
  106: insulating member
  107: insulating layer
  108: guide member
  109: object to be processed 110: grounded part
111: pipe line
112: vent valve
113: gas supply valve
114: vacuum valve
115: vacuum gauge
116: gas supply unit
117: vacuum pump
118: matching device
119: high-frequency power supply unit
120: control unit
121: signal analyzer
124: device controller
130: display unit
140: input unit
160: plasma potential detection sensor
161: dielectric member
162: electrode unit
162a: glass plate
162b: probe electrode
162c: shield electrode (first electrode)
162d: detection lead wire
162e: second electrode
163a, 163b: wiring
170: support member
200: potential detection unit (detection circuit)
201: input terminal
202, 204: operational amplifier
203: reference power source

What is claimed is:

1. A plasma potential measuring device, comprising:
a detection electrode which is disposed so as to face a plasma generated in a chamber and at which an electric charge corresponding to an electric potential of the plasma is induced;
a potential changing circuit for changing a reference potential of the detection electrode; and
a detection circuit for detecting an amount of electric charge or potential induced at the detection electrode,
wherein the detection circuit includes an operational amplifier which has an inverting input terminal and a non-inverting input terminal virtually short-circuited with the inverting input terminal, and wherein one of the inverting input terminal and the non-inverting input terminal is connected to the detection electrode and another one of the inverting input terminal and the non-inverting input terminal is connected to the potential changing circuit such that the reference potential of the detection electrode is changeable by a voltage applied to the other one of the inverting input terminal and the non-inverting input terminal by the potential changing circuit.

2. The plasma potential measuring device according to claim 1, wherein a detection sensitivity of the plasma potential is adjusted by changing the voltage of the potential changing circuit.

3. A plasma potential measuring device, comprising:
a detection electrode which is disposed so as to face a plasma generated in a chamber and at which an electric charge corresponding to an electric potential of the plasma is induced;
a first electrode facing the detection electrode on an opposite side to the plasma;
a first insulating member interposed between the detection electrode and the first electrode; and
an operational amplifier which has an output terminal, an inverting input terminal, and a non-inverting input terminal virtually short-circuited with the inverting input terminal,
wherein
the non-inverting input terminal is connected to the detection electrode and the inverting input terminal and the output terminal is connected to the first electrode such that the first electrode is virtually short-circuited with the detection electrode via the operational amplifier.

4. The plasma potential measuring device according to claim 3, further comprising:
a second electrode facing the first electrode on an opposite side to the detection electrode;
a second dielectric member interposed between the first electrode and the second electrode.

5. The plasma potential measuring device according to claim 4, wherein a constant voltage is applied to the second electrode.

* * * * *